US000001369H

United States Statutory Invention Registration [19]

[11] Reg. Number: H1369

Verbin

[43] Published: Nov. 1, 1994

[54] CABLE CONTINUITY TEST APPARATUS

[76] Inventor: Randolph N. Verbin, 215 Riverside Ave., Ben Lomond, Calif. 95005

[21] Appl. No.: 741,846

[22] Filed: Jul. 29, 1991

[51] Int. Cl.[5] ..... H04B 3/46

[52] U.S. Cl. ..... 324/539; 324/133; 324/541; 324/542; 379/21

[58] Field of Search ..... 324/66, 133, 542, 541, 324/540, 539; 340/635, 633; 379/21

[56] References Cited

U.S. PATENT DOCUMENTS 4,575,588 3/1986 Vyver ..... 324/66

FOREIGN PATENT DOCUMENTS 0652506 3/1979 U.S.S.R. ..... 324/66

OTHER PUBLICATIONS

Weele: "Ribbon Cable Tester"-Elektor-Jul. 1979 p. 7.

*Primary Examiner*—Bernarr E. Gregory

[57] ABSTRACT

Versatile multiconductor cable test apparatus when connected to opposite ends of the cable indicates conductor defects (shorts and opens), reversal of conductors in sequentially connected cables, and identifies the location of a defective conductor or conductors. The apparatus can be readily operated by one person, is quickly connectable to the cable and is constructed with commercially available inexpensive parts.

3 Claims, 6 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CABLE CONTINUITY TEST APPARATUS

BACKGROUND OF THE INVENTION

This invention relates to electric cable test apparatus and more particularly to apparatus for testing installed multiconductor cables for abnormal conditions such as open conductors, short circuits and misconnections.

Use of complex multiunit electronic apparatus often entails operational interconnection of the units by multiconductor electric cables, such as well-known ribbon cables, often connected in tandem. During the course of installation of such cables, conductors therein may be severed or opened, shorted and/or reversed (i.e., a conductor at one end of the cable is misconnected within the cable is misconnected within the cable or from cable to cable to a conductor other than the one intended). In order to check cables to determine if such defects exist, it was previously necessary to sequentially check each individual conductor of the cable with a volt-ohmmeter or the like. Two persons frequently were required to perform these checks on system installed cables. This prior technique was slow, prone to errors, required extra manpower, and when cable ends were widely separated, communication problems between test personnel were frequent, resulting in confusion and mistakes. This invention comprehends apparatus which performs such tests without these disadvantages and drawbacks.

OBJECTS AND SUMMARY OF THE INVENTION

An object of the invention is the provision of cable test apparatus which can be used effectively by one person.

Another object is the provision of such apparatus which is lightweight and portable and facilitates fast and accurate checking of entire multiconductor cables by visual indicators.

Still another object is the provision of such test apparatus which is economical to construct with readily available standard components and which is simple to maintain.

These and other objects of the invention are achieved with apparatus comprising a short detector and a reversal detector detachably connectable to opposite ends of a multiconductor cable or cables. The reversal detector comprises a plurality of multi-color light emitting diodes (LEDs) connected by a pin connector to one end of the cable so that each cable conductor is connected to an LED. The short detector is likewise connected the other end of the cable and has a plurality of bargraph display elements connected to the cable conductors, respectively, and an energy source (battery) connected to the conductors. The combination of energization (or lack thereof) of the LEDs and bar display elements instantly provides visual indications to the operator of the condition of the cable.

DESCRIPTION OF PREFERRED EMBODIMENT

Figure 1:
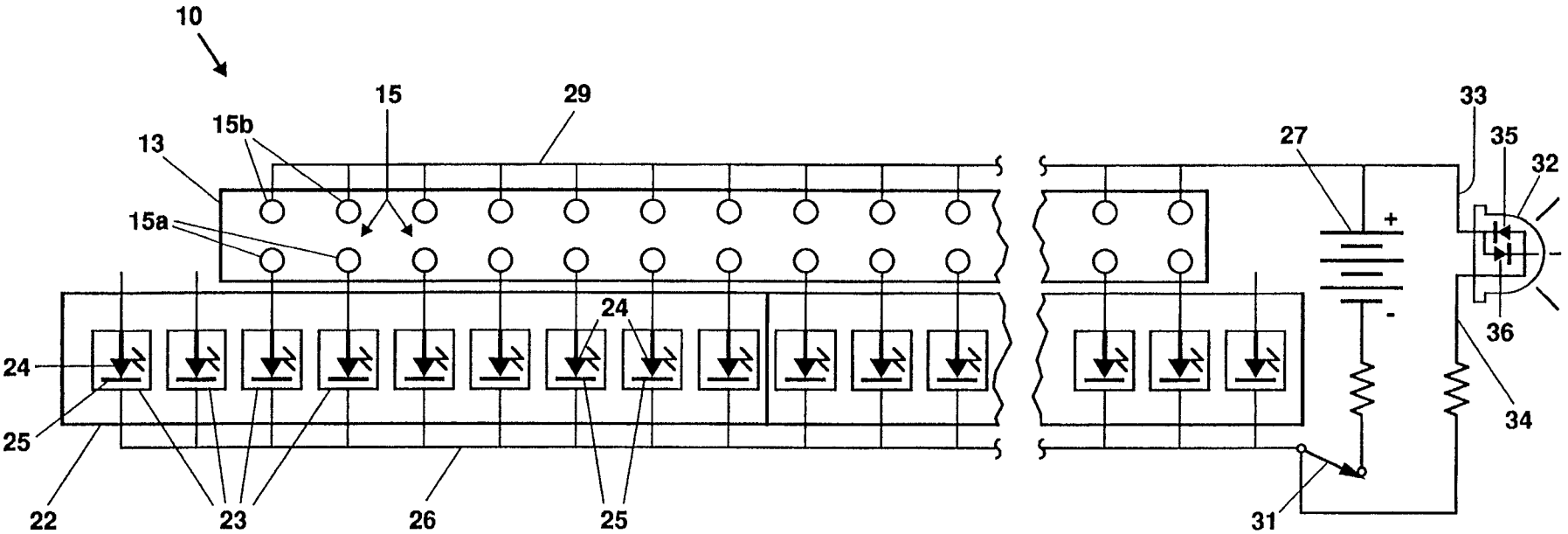
FIG. 1 is a plan schematic view of the short detector portion of the tester apparatus embodying this invention.
Figure 2:
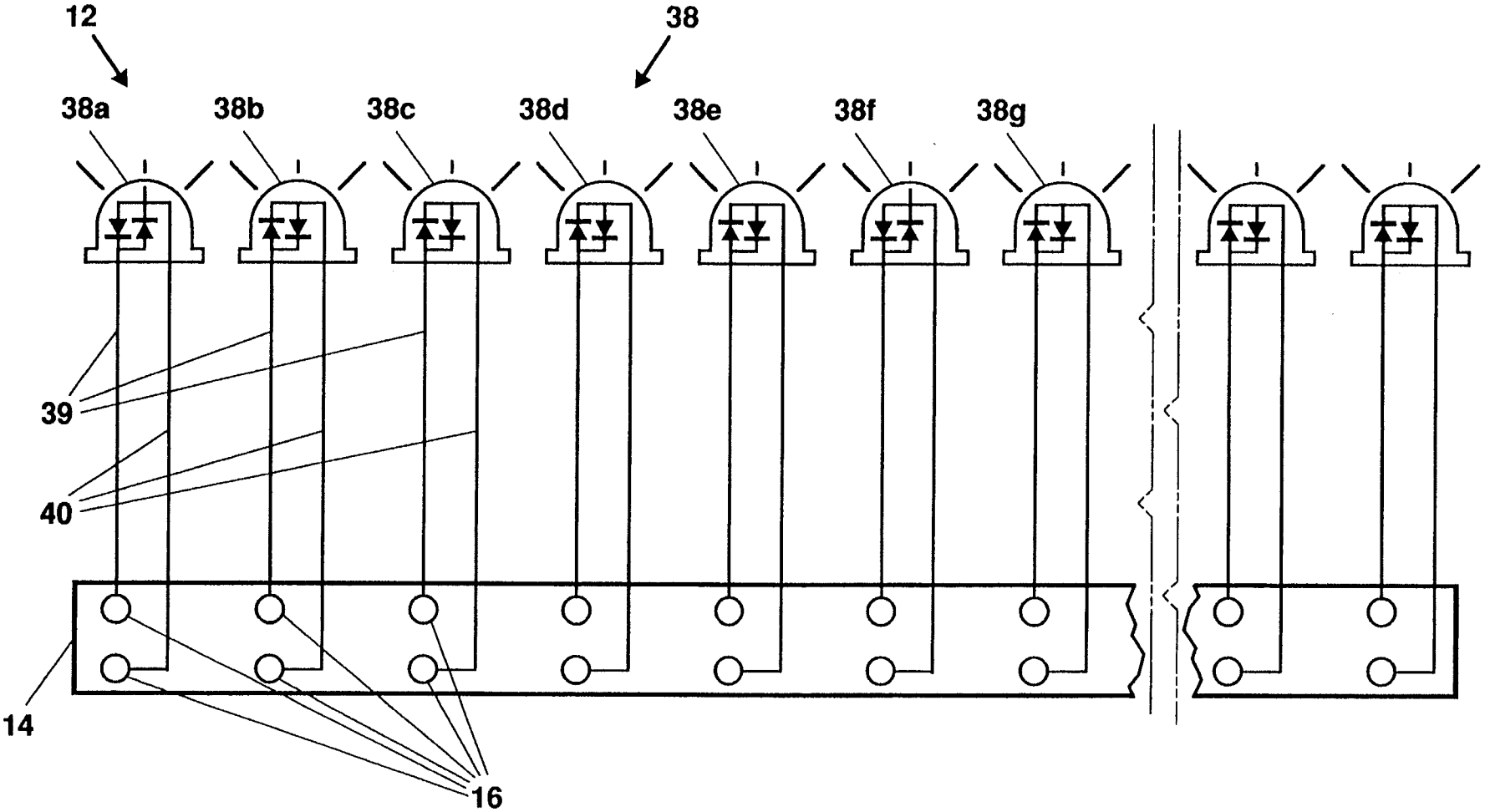
FIG. 2 is a plan schematic view of the reversal detector portion of the tester apparatus embodying this invention.

FIGS. 1 and 2 illustrate a short detector 10 and a reversal detector 12 having male pin blocks 13 and 14, respectively, which are connectible to corresponding female connector blocks at opposite ends of a multiconductor cable 18, see FIGS. 3–6 inclusive, to be tested. By way of example and not of limitation, pin blocks 13 and 14 have 25 pairs of pins 15 and 16, respectively. For clarity of illustration, cable 18 is represented in FIGS. 3–6, inclusive, by a single pair 19*a* and 19*b* of wires instead of the 25 pairs actually comprising the test cable, the connector blocks at opposite ends of wires 19*a* and 19*b* indicated by reference characters 20 amd 21, respectively.

Short detector 10 comprises three 10-element light emitting diode (LED) bargraph displays to accommodate a 25 wire pair cable, one of the displays being indicated at 22 in FIG. 1 and having ten diode eleemnts 23. Each diode has an anode 24 and a cathode 25, the latter being connected by line 26 to the negative terminal of a direct current energy source such as battery 27. Anodes 24 of LEDs 23 are connected to one pin 15*a* of each pair of pins 15 on block 13 and the other pin 15*b* of each pair of pins 15 is connected by a common line 29 to the positive terminal of battery 27. A switch 31 is provided between line 26 and battery 27 to permit deactivation of the apparatus when not in use. Tri-color LD 32 is connected across lines 26 and 29. The color of light emitted by LED 32 (only two colors re used in the practice of this invention) indictes the correctness of battery polarity orientation, i.e., green indicates proper battery polarity and red indicates reversal. LED 32 has two terminals 33 and 34 connected across battery 27 and two diodes 35 and 36 reversely connected across terminals 33 and 34 so that the direction of current passing through LED 32 is indicated by the color emitted thereby. LED 32 as well as diodes 23 are commercially available components sold at electronics chain stores such as Radio Shack.

Reversal detector 12, see FIG. 2, is connected to the end of multiconductor cable 18 opposite from that to which short detector 10 is connected and comprises a plurality of tri-color LEDs 38, each having two terminals 39 and 40 and connected to a pair of pins 16 in pin block 14. LEDs 38 are identical to LED 32 in construction and operation and like the latter use only two of three colors in this invention. In order to facilitate location of defective location of defective conductors in a multiconductor cable, the positions of electrodes in LEDs 38 at predetermined locations in the entire set are reversed relative to positions of those electrodes in the remaining LEDs 38. For example, electrodes in LEDs 38*a* and 38*f* in the group of LED 38*a*–38*g*, inclusive, in FIG. 2 are polarity reversed as compared to the remainder of the LEDs in that group. If the pair of cable conductors to which LED 38*d* is connected are defective, i.e., reversed, LED 38*d* emits red light indicating that the defective conductor pair, is the third pair from the pair connected to LED 38*a*. By reversing the polarity of electrodes in, say, every fifth LED (as shown), identification of the location of a defective conductor pair in the cable is facilitated.

Figure 3:
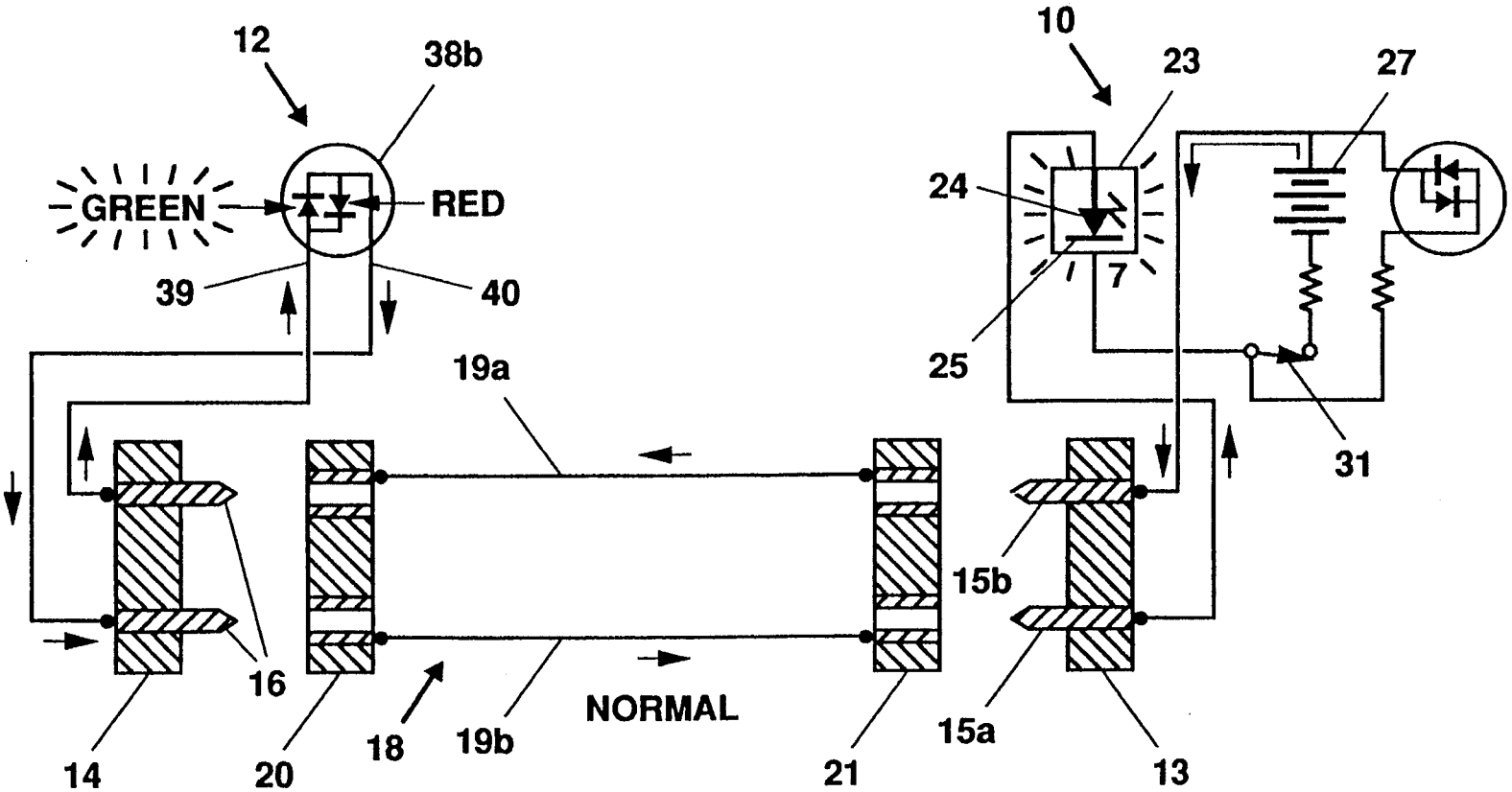
FIG. 3 is a schematic view of the apparatus of this invention connected to one pair (of a plurality of pairs) of cable conductors showing operation of the apparatus when there are no defects in the cable.

Operation of the test apparatus is better understood by reference to FIGS. 3–6, inclusive, for operating conditions wherein cable 18 is normal (i.e., functioning properly), or has conductors 19*a* and 19*b* that are open, reversed or shorted. Referring to FIG. 3, short detector 10 is connected to one end (right end, as viewed) of normally functioning cable 18 by pins 15 in block 13. Similarly, reversal detector 12 is connected through pins 16 of block 14 to the opposite end of cable 18, with switch 31 of battery 27 closed, current flows from the positive terminal of the battery through pin 15 and wire 19*a* to pin 16 and terminal 39 of LED 38*b* of reversal detector 12. The return path is through terminal 40 of LED 38*b*, pin 16, conductor 19*b*, and pin 15*a* to anode 24 of diode element 23. With this polarity of energization, LED 38*b* emits green light as shown and bargraph element lights up, all indicating a normal condition and a properly functioning cable. Since bargraph display 22 and LEDs 38 are plainly visible even at a considerable distance, only one operator is needed to conduct this and the other tests explained below.

Figure 4:
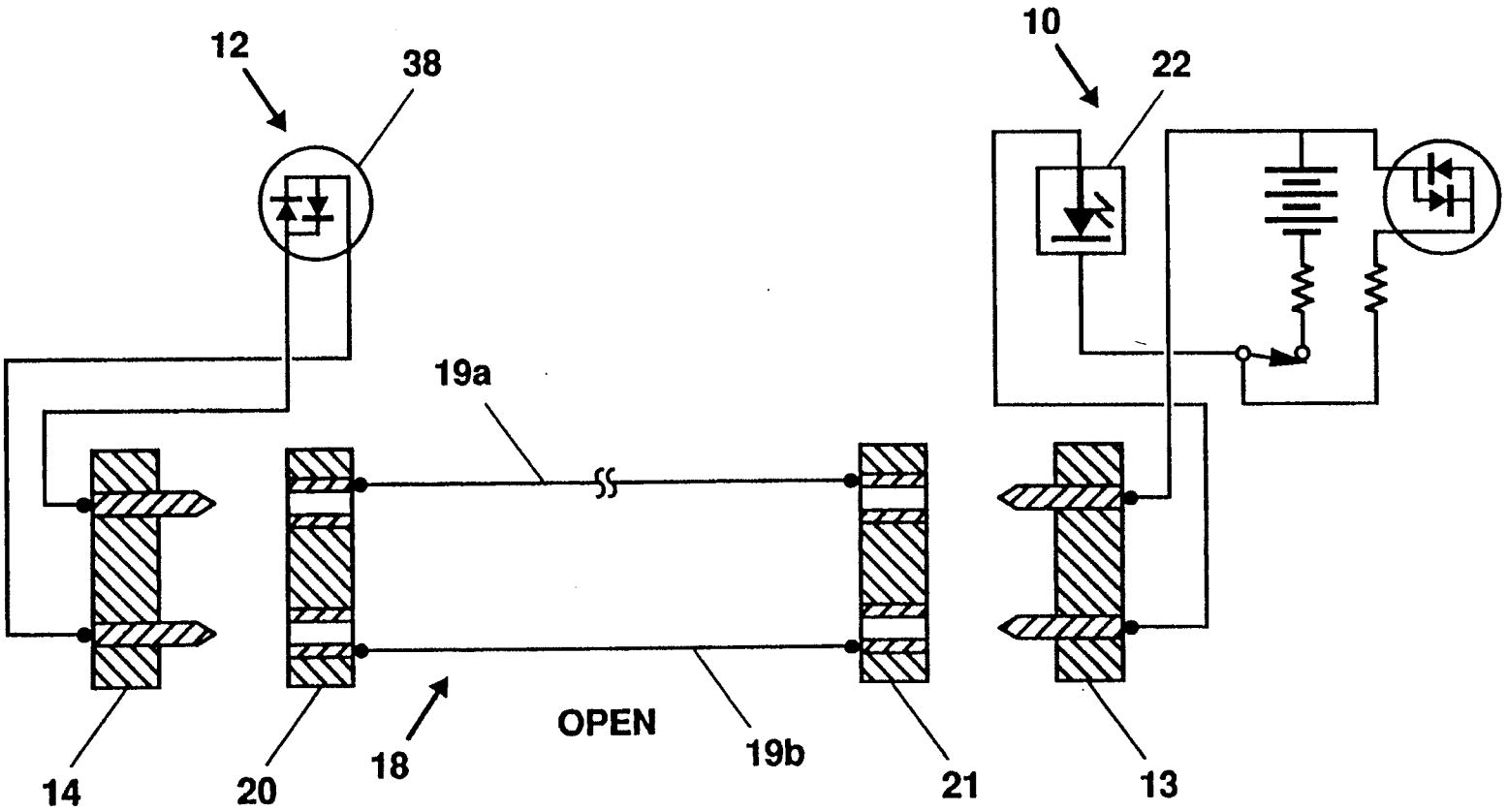
FIGS. 4, 5 and 6 are views similar to FIG. 3 showing operation of the test apparatus for conditions of an open conductor, reversal of conductors and shorted conductors, respectively, in the cable.

FIG. 4 illustrates a cable condition in which conductor 19*a* of cable 18 is open. The effect of this open circuit is to break the path of current flow through bargraph display 22 and LEDs 39 so that no light is emitted from these indicators, signalling an open circuit.

Figure 5:
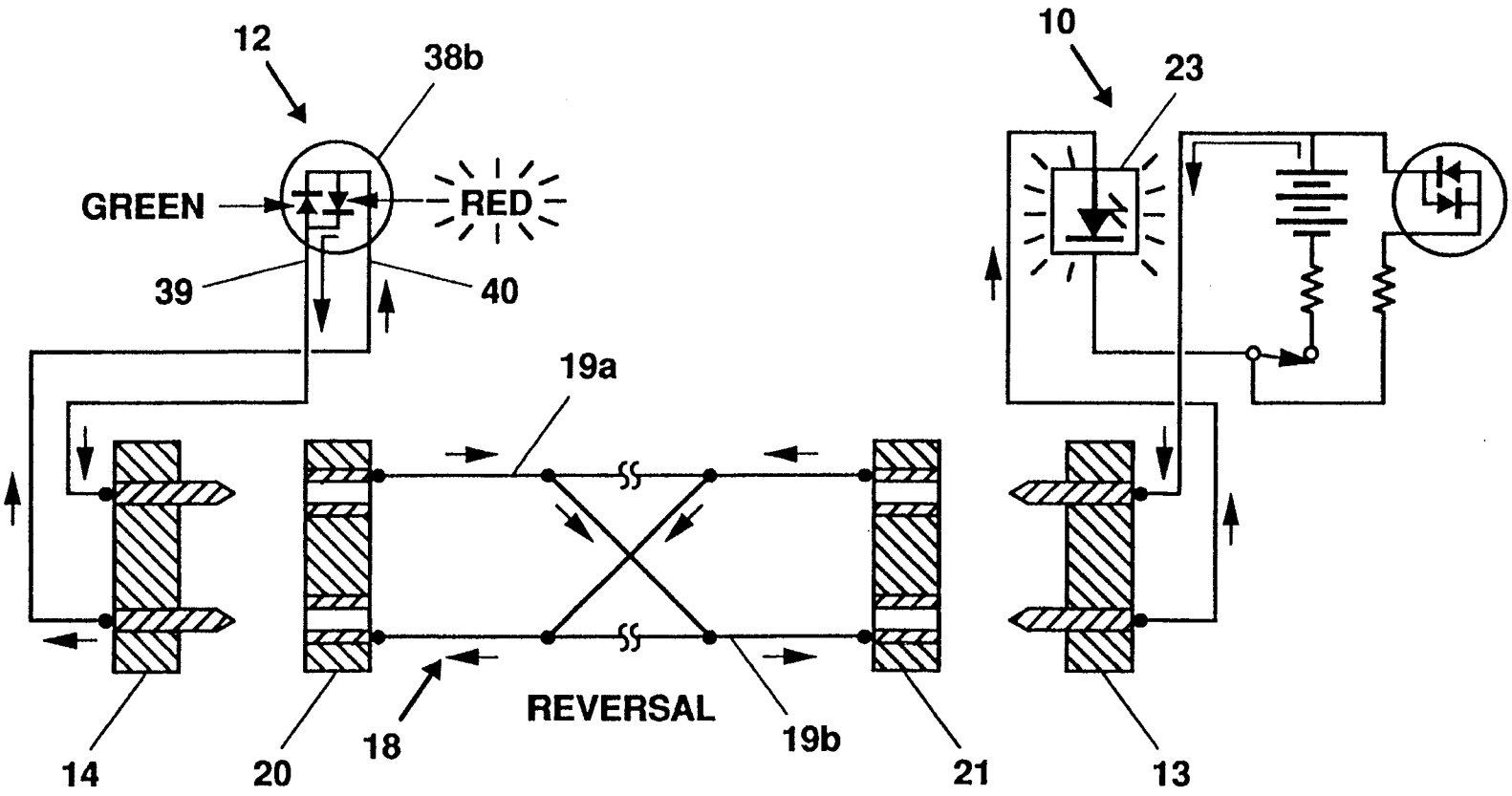

FIG. 5 shows a cable condition in which the effective positions of conductors 19*a* and 19*b* between the cable ends are reversed. This condition is more likely to occur through installation error when several cables are connected on tandem. As a result, current flow through the conductors is reversed from one cable end to the other, causing a reversal of energization polarity of reversal detector LED 38*b* so that it emits red light instead of green. In the example shown in FIG. 5, the double reversal of the flow of current through conductors 19*a* and 19*b* results in no change in polarity of energization of bargraph display element 23 which accordingly emits light. Therefore, red light emission from LED 38*b* of reversal detector 12 accompanied by light emission from bargraph display element 23 indicates a reversal of cable conductors.

Figure 6:
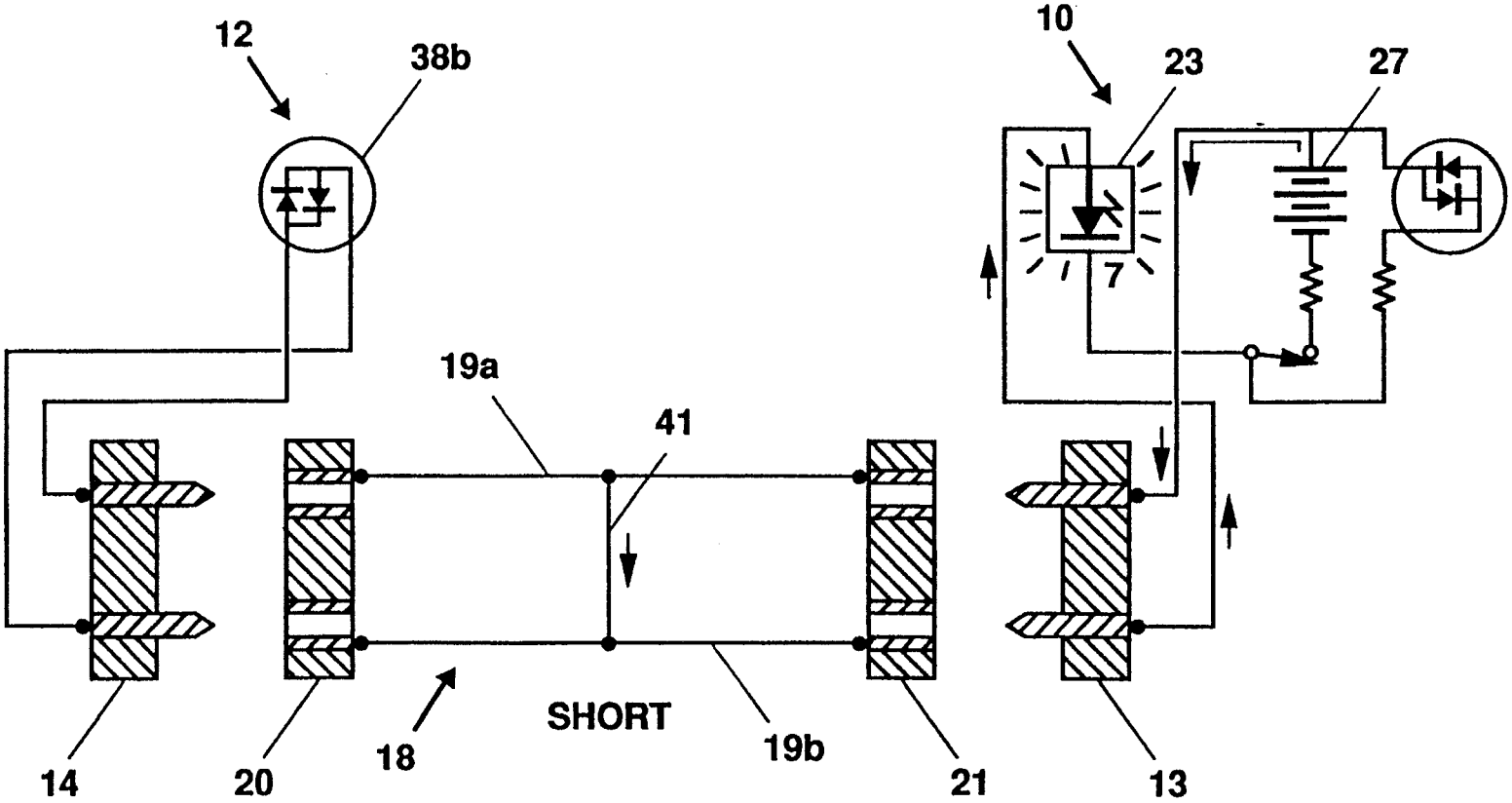

The final abnormal condition of a multiconductor cable is that of a short circuit between a pair of conductors as illustrated in FIG. 6. In this case, current from battery 27 is diverted by the short, indicated at 41, from conductor 19*a* to conductor 19*b* and does not reach reversal detector 12. Accordingly reversal detector LED 38*b* is not energized and does not emit any light. However, the diode elements, 23 of bargraph display are properly energized and do emit light as indicated. Therefore illumination of bargraph display 22 and no illumination of diodes 38 n reversal detector 12 indicates a short circuit in cable 18.

In addition to the utility of the test apparatus embodying this invention to running checks on ribbon cables, it is equally advantageous when used in testing other multiconductor devices such as shielded multiconductor cable assemblies, individually shielded multiconductor assemblies, printed wiring assemblies, and similar assemblies through use of a proper interfacing adapter.

What is claimed is:

1. Test apparatus for multiconductor cable having a plurality of pairs of coextensive conductors, each of said conductors being connected at opposite ends to connectors, said apparatus comprising:

a short detector connected to one end of the cable and a reversal detector connected to the other end of the cable;

said short detector comprising a plurality of bargraph display elements, said elements having anodes and cathodes, said cathodes respectively connected across said pairs of conductors, said detector also having a direct current source with a positive terminal and a negative terminal, said positive terminal being connected to first conductors of each of said pairs of conductors, said negative terminal being connected through the cathodes and anodes of said display elements to the second conductors of each of said pairs of conductors, each of said elements emitting light when energized by electric current passing therethrough from anode to cathode;

said reversal detector comprising a plurality of light-emitting diodes (LEDs), each LED having first and second terminals and each LED being capable of emitting light in open of at least two colors depending on the direction of flow of electric current through said LED, the first of said LED terminals being connected to said first conductors and the second of said LED terminals being connected to said second conductors whereby light at a first color from an LED indicates reversal of an associated pair of conductors in said cable and light at a second color indicated correct orientation of the associated pair of conductors;

the combination of energization or lack of energization of said elements and said LEDs together with the color of light emitted by said LEDs providing indications of open, reversal, shorted or normal conditions of identified conductors in said cable.

2. Apparatus according to claim 1 in which several LEDs at equally spaced intervals throughout said plurality of LEDs are reversely connected to said said conductors whereby normally to produce light having a color different from that of the remaining LEDs for facilitating location of defective conductors.

3. Apparatus according to claim 1 in which each of said conductors is connected at opposite ends to female connectors, said LEDs and said display elements being connected to male connectors.

* * * * *